United States Patent

Marx et al.

[11] Patent Number: 6,104,187
[45] Date of Patent: Aug. 15, 2000

[54] MAGNETO-RESISTIVE ANGLE SENSING DEVICE WITH A TEMPERATURE-STABLE ZERO POINT

[75] Inventors: Klaus Marx; Franz Jost, both of Stuttgart, Germany

[73] Assignee: Robert Bosch GmbH, Stuttgart, Germany

[21] Appl. No.: 09/068,777

[22] PCT Filed: Aug. 23, 1997

[86] PCT No.: PCT/DE97/01834

§ 371 Date: May 14, 1998

§ 102(e) Date: May 14, 1998

[87] PCT Pub. No.: WO98/14792

PCT Pub. Date: Apr. 9, 1998

[30] Foreign Application Priority Data

Oct. 2, 1996 [DE] Germany .......................... 196 40 695

[51] Int. Cl.$^7$ .............................. G01B 7/14; G01R 33/06; G01D 5/18
[52] U.S. Cl. ................. 324/207.21; 324/207.12; 324/202; 324/207.25
[58] Field of Search ............................ 324/207.2, 207.21, 324/207.19, 207.12, 207.24, 207.25, 252, 225, 202, 760; 338/32 R

[56] References Cited

U.S. PATENT DOCUMENTS

5,351,003   9/1994   Bauer et al. ........................ 324/207.12

FOREIGN PATENT DOCUMENTS

275306   1/1990   German Dem. Rep. .

43 36 482 A1   4/1995   Germany .

OTHER PUBLICATIONS

Kwiatkowski et al., "The permalloy magnetoresistive sensors–properties and application", The Journal of Physics 19, pp. 502–515, Jul. 1986.

Eijkel et al., "A Thin–film Magnetoresistive Angle Detector", Sensors and Actuators, A21–A23, pp. 795–798, Mar. 1990.

*Primary Examiner*—Jay Patidar
*Attorney, Agent, or Firm*—Michael J. Striker

[57] ABSTRACT

The contactless magneto-resistive angle sensing device (1) includes two sensor components (10,11) oriented at a fixed angle relative to each other, a controllable power supply (PW) to heat and maintain the sensor components (10,11) at different temperatures, a magnet (MG) producing a magnetic field (B) in which the sensor components are arranged and an evaluating device (12) to receive output signals (U1,U2) from the sensor components (10,11). Each sensor component (10,11) includes magneto-resistive resistors (MR) connected in a respective bridge (B1,B2) having input terminals (I1,I1';I2,I2') for supply of current and output terminals (O1,O1';O2,O2') for the output signal (U1,U2). In a rotating magnetic field the evaluating device (12) analyzes the output signals (U1,U2) as a function of field angle and temperature to determine a reference angle at which the output signals of the angle sensing device have a minimum temperature dependence and stores the reference angle as a zero point for subsequent angular measurements. The sensor components are then mounted on a rotatable part whose angular position is to be subsequently measured at an angular position in relation to a stationary magnetic corresponding to the reference angle.

4 Claims, 4 Drawing Sheets

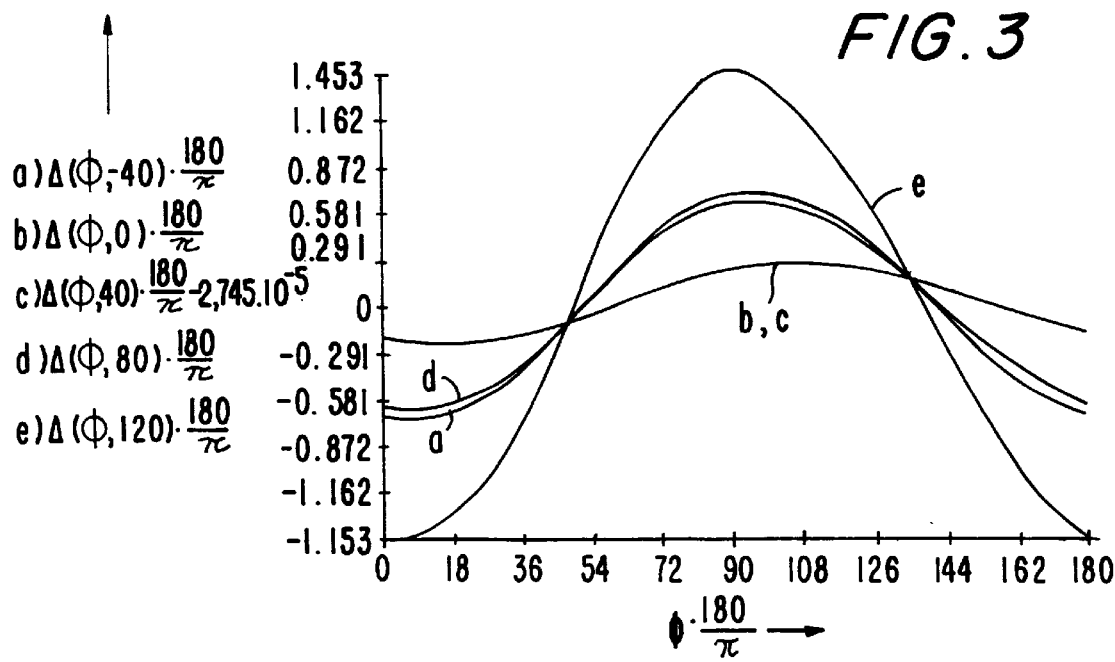
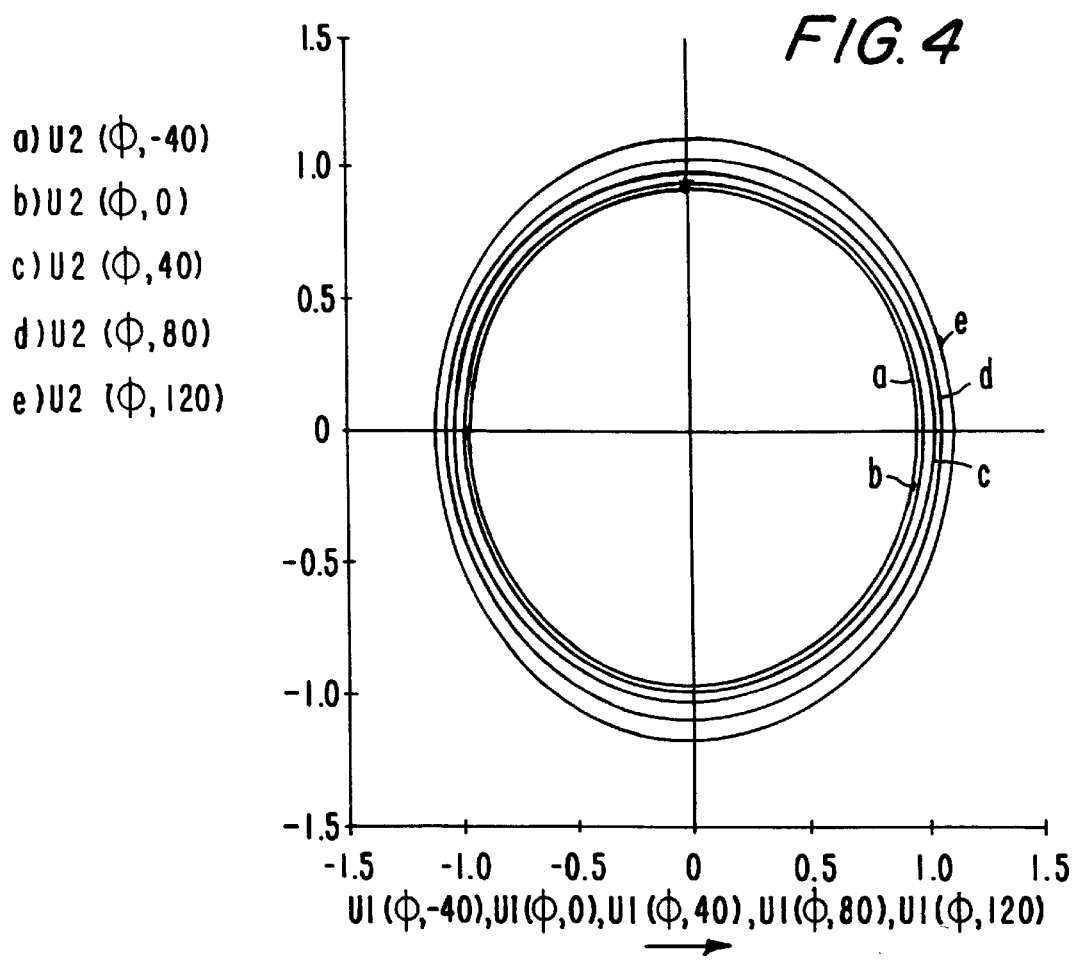

MAGNETO-RESISTIVE ANGLE SENSING DEVICE WITH A TEMPERATURE-STABLE ZERO POINT

BACKGROUND OF THE INVENTION

1. Field of the Invention

The present invention relates to magneto-resistive sensing devices for position measurement and, more particularly, to a contactless magneto-resistive angular position sensing device with a temperature-stable zero point that produces an output signal according to its angular position in an applied magnetic field.

2. Prior Art

It is known to use magneto-resistive sensors for contactless detection of changes in state, for instance for measuring an angular position of a rotatably mounted part. Such magneto-resistive sensors typically include magnet-field-dependent resistors which are connected in a bridge, and through which a control current that is fed to a bridge diagonal flows.

When such a magneto-resistive sensor is influenced by a magnetic field, a voltage is established at the other bridge diagonal, the magnitude of the voltage depending on the magnetic field or on the direction of the magnetic field referred to the sensor. The relationship between the bridge voltage and the magnetic field direction is utilized in a contactless AMR (Anisotropic Magneto Resistance) angle encoder for detecting measurement values. If precise measurement is to be possible at all, a zero point must first be defined, or a calibration of the sensor must be performed.

From Published, Non-Examined German Patent Application DE-OS 43 364 82, a method for calibrating a magneto-resistive sensor is known with which the offset error can be compensated for. To that end, the magneto-resistive sensor, which is constructed as a bridge circuit, is acted upon by a homogeneous magnetic field oriented in a definite way, and a definite control current is applied to the current contacts of the bridge circuit. The voltage that is then established at the other contacts is measured on an ongoing basis. The magneto-resistive sensor is processed with the aid of a laser until such time as the offset voltage when the magnetic field is applied becomes equal to zero.

SUMMARY OF THE INVENTION

Since magneto-resistive sensors typically furnish a temperature dependent output voltage, it is the object of the present invention to provide a magneto-resistive angle sensing device with a temperature-stable zero point, or to subject a conventional magneto-resistive sensing device to a calibration method that assures that a maximum temperature stability at the zero point is attained.

According to the invention the contactless magneto-resistive angle sensing device comprises means for producing a magnetic field; two sensor components arranged in the magnetic field at a predetermined fixed angle relative to each other, wherein each sensor component includes a plurality of magneto-resistive resistors connected in a respective bridge, each bridge includes input terminals for a respective input voltage and output terminals for a respective output signal, the input terminals are arranged diagonally across from each other in each bridge along one bridge diagonal thereof and the output terminals are arranged diagonally across from each other along another bridge diagonal; controllable power supply means for providing the respective input voltages to heat and maintain the sensor components at different temperatures; and evaluation means connected with the sensor components to receive and analyze the output signals from the sensor components in response to the magnetic field and input voltage. The evaluation means analyzes the output signals in a preferably rotating magnetic field as a function of field angle and sensor component temperature to determine a reference angle or angles at which the output signals of the angle sensing device have a minimum temperature dependence and stores the reference angle or angles as a zero point for subsequent angular measurements.

The method according to the invention has the advantage that a conventional magneto-resistive sensor compound can be used and that nevertheless a temperature-stable zero point can be established without having to change the basic construction of the magneto-resistive sensor.

This advantage is attained in that first the suitable zero point of the magneto-resistive sensor is sought. To that end, in the case of an angle sensor for instance, the magneto-resistive sensor is exposed to a rotating magnetic field, and the angular error, that is, the difference between the measured angle and the actual angle, is ascertained. This angular deviation is ascertained at various temperatures, but two different temperatures suffice. A comparison of the angular deviations measured at various temperatures shows that an especially small angular deviation occurs for some reference angles. This is a property of the magneto-resistive sensors which is reproducible and can also be confirmed by simulation. If an angle at which the angular deviation is only slightly dependent on the temperature is selected as the zero point angle, then the desired temperature stability of the zero point is obtained.

BRIEF DESCRIPTION OF THE DRAWING

The objects, features and advantages of the invention will now be illustrated in more detail with the aid of the following description of the preferred embodiments, with reference to the accompanying figures in which:

FIGS. 3 and 4 are graphical illustrations of further relationships of variables in simulation calculations;

DESCRIPTION OF THE PREFERRED EMBODIMENTS

Figure 1:
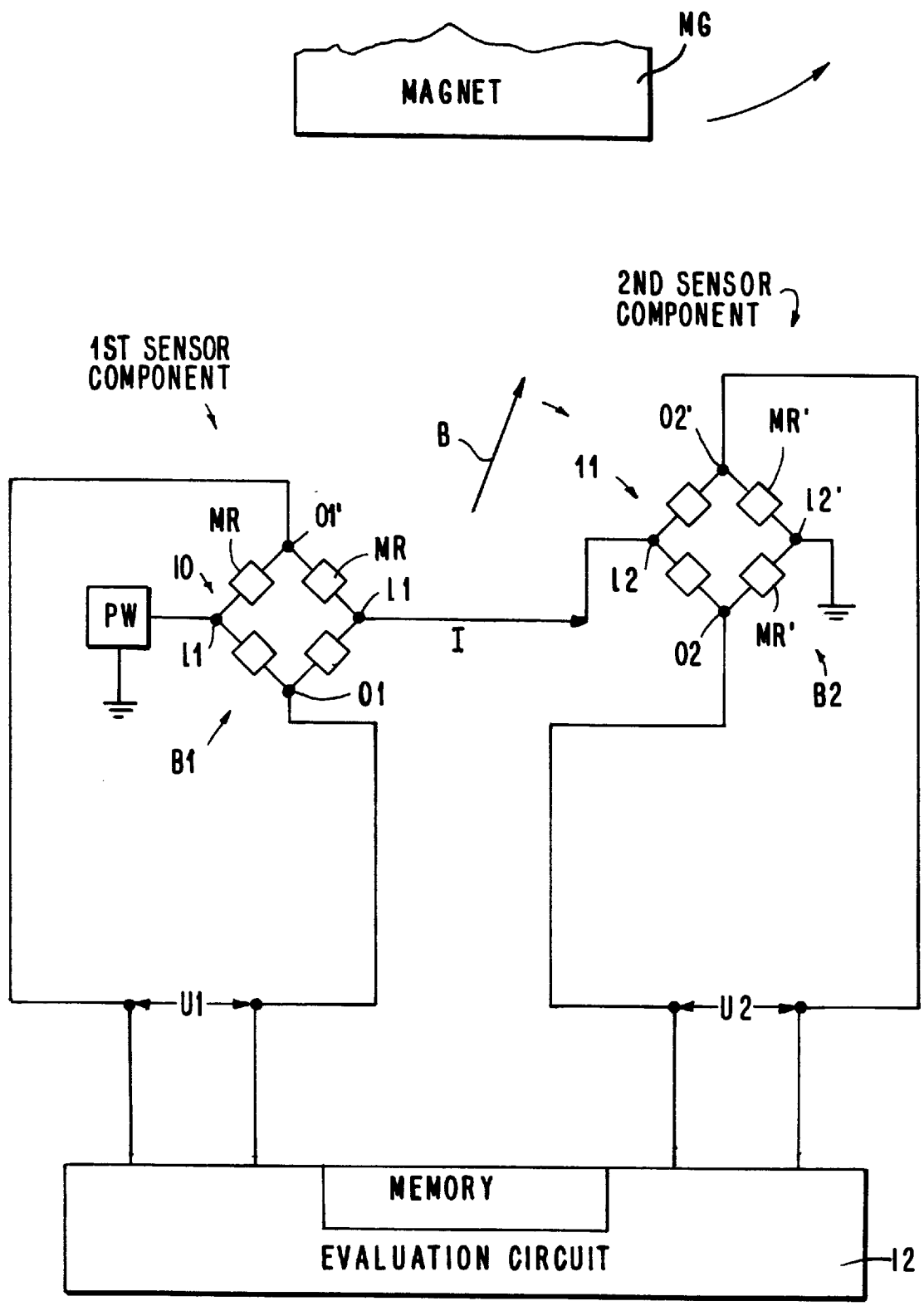
FIG. 1 is a block circuit diagram of a magneto-resistive angle sensing device.

In FIG. 1, one example of a contactless magneto-resistive sensor is shown, having two AMR (Anisotropic Magneto Resistance) sensor components 10, 11 rotated by 45° from one another, which in the exemplary embodiment are designed as resistance bridges B1,B2 but may also be embodied differently. Each resistance bridge B1,B2 includes a plurality of magneto-resistive resistances MR,MR' connected in the well known bridge circuit arrangement. A current I is delivered from the controllable power supply PW to the serially connected bridges B1,B2 so as to produce respective input voltages or voltage drops across the corresponding input terminals I1,I1';I2,I2' diagonally across from each other in the respective bridges.

If the two sensor elements 10, 11 rotated by an angle of 45° from one another experience a flow of current I, then the voltages U1, U2 are established across the respective output terminals O1,O1';O2,O2' of the bridges diagonally across from each other and can be evaluated, for instance in an evaluation circuit 12, for angle measurement.

If a sensor such as that shown in FIG. 1 is used as a contactless angle sensor, for instance for measuring the throttle valve position, or as a pedal value transducer, then for the evaluation it is necessary to assure that the zero point position of the sensor is temperature-stable. The zero point of the angle sensor is defined by the control unit for a certain temperature. The thus-defined electronic zero point should very only slightly with the temperature, because otherwise problems with idling control or with a mechanical stop can arise.

The reduction in temperature dependency at the zero point is attained, with the conventional use of AMR sensors, for instance by means of complicated wiring or by using special filters. In the present invention, another course is taken, which is based on the recognition that there are certain angles at which the angular error, or the temperature dependency of the angular error, is minimal. The fact that such special angles do exist, at which minimal temperature dependency occurs, can be ascertained both by simulation and by measurements. If such a special angle is defined as the zero point angle, then the desired temperature stability is obtained.

The method by which the special angle, that is, the angle that later serves as the zero point angle, is ascertained can be described as follows: in a rotating magnetic field, B produce, e.g., by the magnet MG the angular deviation is first determined at room temperature T1; to that end, the output voltage U (ϕ,t) is measured as a function of the magnetic field direction, and by way of example measurement over the entire 360° can be performed.

Since the sensor components comprise magneto-resistive resistors MR, MR, it is possible by applying a higher current I through the sensors or the sensor bridge B1,B2 to heat them to a higher temperature T2. Once the second temperature T2 is reached, the angular deviation is ascertained again, and the magnitude by which the magnetic field direction, measured with the aid of the sensor, differs from the actual magnetic field direction is assumed to be the angular deviation. If the two angular deviations are plotted over the angle, the result is a plurality of intersections of the two curves. Each of these intersections represents a special angle that can be used as an electronic zero point.

Figure 2:
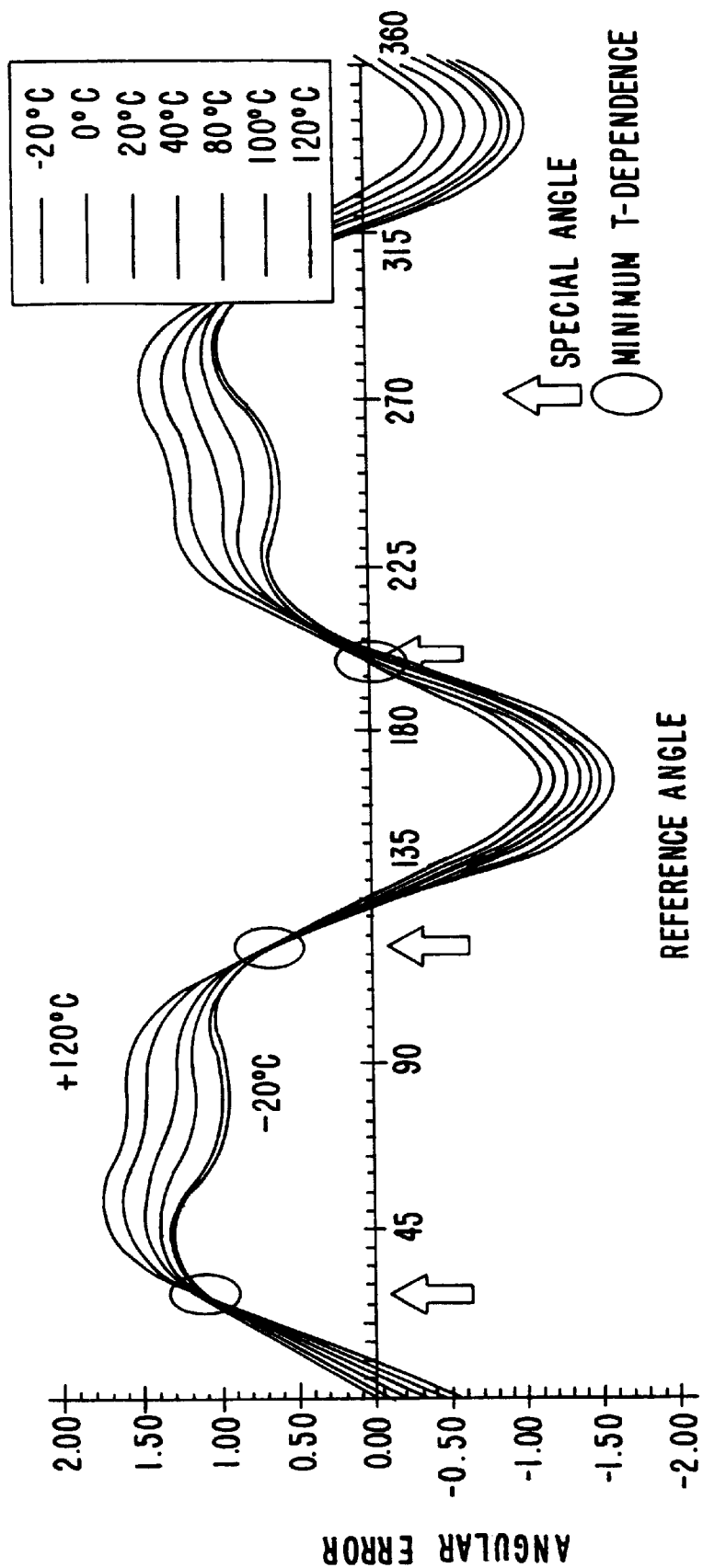
FIG. 2 is a graphical illustration of angular deviation as a function of measured angle values.

If the measurements are repeated at various temperatures T1, T2, T3, . . . ), the relationship shown in FIG. 2 results between the angular deviation and the reference angle or special angle, which corresponds to the direction of the magnetic field. The curves obtained for various temperatures all intersect at certain angles, which represent the aforementioned special angles.

In the mounting of the sensor in the housing, or the mounting of the magnet relative to the sensor or to the sensor housing, the fact that one of the special angles obtained is used as the zero point is taken into account. The exact calibration can optionally be done by means of an electronic correction.

By the described method for determining a temperature-resistant zero point position and the ensuing assembly of the sensor in the magnets to be scanned, it is also possible in principle to perform a linear correction of the offset within a certain angular range, and as a result the angular accuracy can be increased further.

In principle, the method can also be extended to travel distance measurements, in which once again voltage courses of the output signal of the sensor should be picked up at various temperatures as a function of travel distance and compared with one another, in order to ascertain at least one special point with only slight temperature dependency.

As can be demonstrated in a computer simulation, there are certain preferential positions or preferential angles, for which the temperature dependency of the output signal of the magneto-resistive sensors is minimal. One example of such a simulation calculation will now be described. The following abbreviations and relationships will be used:

$$j = \sqrt{-1}$$

$$\Phi = 0 * \frac{\pi}{180}, 1 * \frac{\pi}{180}, \ldots, 180 * \frac{\pi}{180}$$

$$t = -40, 20, \ldots, 120°C.$$

$$\alpha = 0.001 \quad \beta = 0.001 \quad A1 = 1 \quad A2 = 1$$

$$\gamma = 0.001 \quad \delta = 0.001 \quad O1 = 0.005 \quad O2 = 0.005 \quad \sigma = 0.001$$

in which ϕ is the mechanical angle to be determined
t is the temperature of the sensor in °C.
α, β, γ, δ, A1, A2, O1, O2, σ are examples of factors.
For the voltages, the following relationships apply:
Voltage courses:
U1d(t)=(A1)*(1+α*(t−20))
U2d(t)=(A2)*(1+β*(t−20))
U10(t)=(O1)*(1+γ*(t−20))
U20(t)=(O2)[1+δ*(t−20)+σ(t−20)$^2$]
U1(Φ,t)=U10(t)+U1d(t)*cos(2Φ)
U2(Φ,t)=U20(t)+U2d(t)*sin(2Φ)
U(Φ,t)=U1(Φ,t)+j*U2(Φ,t)
Examples:
U1d(20)=1
U2d(20)=1
U10(20)=0.005
U20(30)=−0.00555
in which:
U1d(t) is the amplitude of the temperature-dependent voltage of the first sensor element 10
U2d(t) is the amplitude of the temperature-dependent voltage of the second sensor element 11
U10(t) is the offset voltage of the first sensor element 10
U20(t) is the offset voltage of the second sensor element 11
U1(ϕ,t) is the sensor signal of the first sensor element 10
U2(ϕ,t) is the sensor signal of the second sensor element 11
U(ϕ,t) is the total output voltage of the sensor (an ellipse in the complex plane)
Taking into account the fact that the phase differences between two complex numbers is equal to the phase of the product

[argz1−argz2=arg(z1*z2)], the following equation is obtained:

$$\Delta(\Phi, t) = \frac{1}{2} * arg(U(\Phi, t) * e^{-2*j*\Phi})$$

Δ(Φ,t) designates the angular error; this is the difference between the electrically measured angle and twice the mechanical angle. The term "mechanical angle" means the mechanical angle to be detected, which is twice the mechanical angle since the voltages U1(φ,t) and U2(φ,t) depend on sin(2φ) and cos(2φ).

Figure 5:
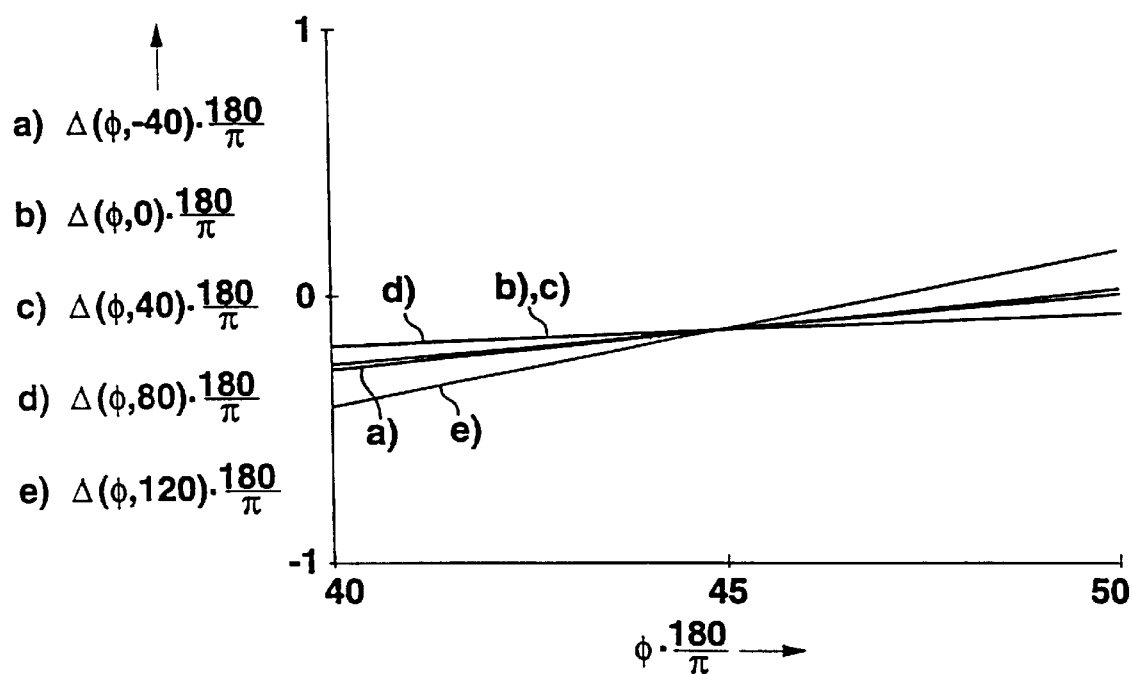
FIG. 5 is a graphical illustration showing the variation of the derivative or differential of the angular error on the angular position.
Figure 6:
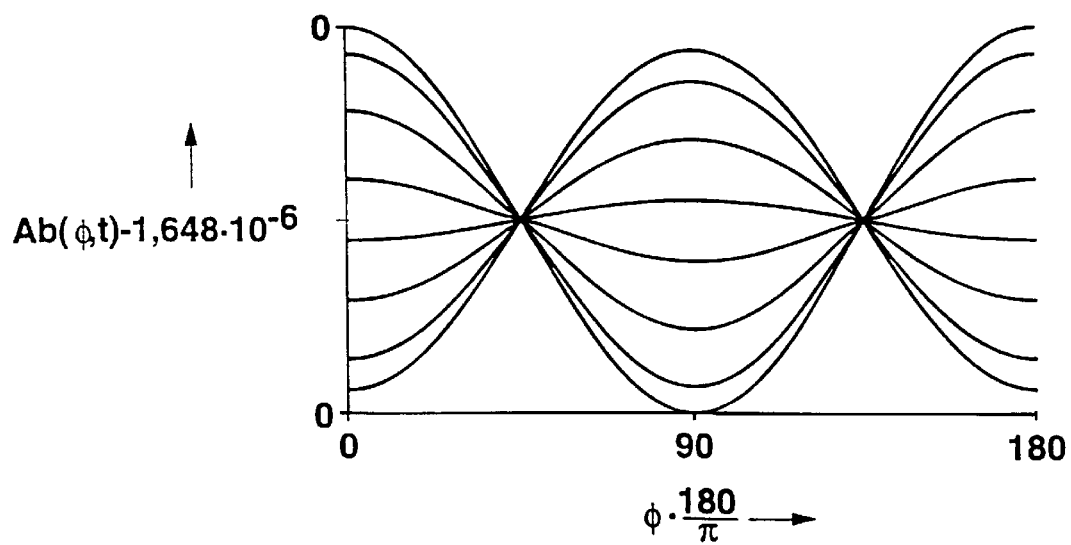
FIG. 6 is a graphical illustration showing the dependence of angular errors on reference angle for various temperature, with regions suitable as special angles characterized by minimal temperature dependency.

The results of the simulation calculation are shown in FIGS. 3, 4, 5 and 6. FIG. 3 and FIG. 5 show the course of the angular error over the angle for various temperatures. In FIG. 4, the relationship is shown between U2 and U1 for various temperatures, and in FIG. 6 the derivative of the angular error $$Ab(\Phi, t) = \frac{d}{dt}\Delta(\Phi, t)$$

is given. At special angles, this derivative is equal to zero.

What is claimed is:

1. A contactless magneto-resistive angle sensing device (1) for determining an angular position of the magneto-resistive angle sensing device in a stationary magnetic field, said magneto-resistive angle sensing device comprising mean (MG) for producing a magnetic field (B);

two sensor components (10,11) arranged in said magnetic field (B) at a predetermined fixed angle relative to each other, wherein each of said sensor components (10,11) includes a plurality of magneto-resistive resistors connected in a respective bridge (B1,B2), each of said bridges includes input terminals (I1,I1';I2,I2') for a respective input voltage across said input terminals and output terminals (O1,O1';O2,O2') for a respective output signal (U1,U2), said input terminals (I1,I1';I2,I2') are arranged diagonally across from each other in each of said bridges (B1,B2) along one bridge diagonal thereof and said output terminals (O1,O1';O2,O2') are arranged diagonally across from each other in each of said bridges (B1,B2) along another bridge diagonal thereof;

a controllable power supply means (PW) for supplying electric power to said sensor components (10,11) to heat and maintain said sensor components at a plurality of different temperatures; and evaluation means (12) connected with said sensor components to receive said output signals (U1,U2) from said sensor components (10,11) in response to said magnetic field (B) and said input voltages; and wherein said evaluation means (12) includes means for analyzing said output signals (U1,U2) analyzes the output signals (U1,U2) as a function of magnetic field angle and temperature to determine a reference angle at which the output signals of the sensor components have a minimum temperature dependence and means for storing the reference angle as a zero point for subsequent angular measurements.

2. The contactless magneto-resistive angle sensing device as defined in claim 1, wherein said evaluation means (12) includes at least one microprocessor with at least one associated memory and said reference angle is stored in at least one associated memory.

3. A method of determining a reference angle at which output voltages of a contactless magneto-resistive angle sensing device have a minimum temperature dependence, said reference angle providing a zero point for subsequent angular measurements, wherein said contactless magneto-resistive angle sensing device comprises means (MG) for producing a magnetic field (B), two sensor components (10,11) arranged in the magnetic field at a predetermined fixed angle relative to each other, wherein each of said sensor components (10,11) includes a plurality of magneto-resistive resistors (MR,MR') connected in a respective bridge (B1,B2), each of said bridges includes input terminals (I1,I1'; I2,I2') for a respective input voltage and output terminals (O1,O1';O2,O2') for a respective output signal (U1,U2), said input terminals (I1,I1';I2,I2') are arranged diagonally across from each other in each of said bridges (B1,B2) along one bridge diagonal thereof and said output terminals (O1,O1';O2,O2') are arranged diagonally across from each other in each of said bridges (B1,B2) along another bridge diagonal thereof; and a controllable power supply means (PW) for supplying electric power to said sensor components (10,11); said method comprising the steps of:

a) placing said contactless magneto-resistive angle sensing device in a rotating magnetic field;

b) controlling said input voltages to heat and maintain said two sensor components at at least two different temperatures with said power supply (PW);

c) measuring said output signals (U1,U2) as a function of orientation angle (φ) of said rotating magnetic field at each of said at least two different temperatures to obtain measured orientation angles and a family of curves representing a dependence of angular deviation of measured and actual angular position as a function of temperature;

d) determining at least one special angle at which said curves obtained by step c) intersect; and e) storing said at least one special angle as reference angle for subsequent angular measurements.

4. A method of making measurements of an angular position of a contactless magneto-resistive angle sensing device in a stationary magnetic field, wherein said contactless magneto-resistive angle sensing device comprises means (MG) for producing a magnetic field (B), two sensor components (10,11) arranged in the magnetic field at a predetermined fixed angle relative to each other, wherein each of said sensor components (10,11) includes a plurality of magneto-resistive resistors (MR,MR') connected in a respective bridge (B1,B2), each of said bridges includes input terminals (I1,I1'; I2,I2') for a respective input voltage and output terminals (O1,O1';O2,O2') for a respective output signal (U1,U2), said input terminals (I1,I1';I2,I2') are arranged diagonally across from each other in each of said bridges (B1,B2) along one bridge diagonal thereof and said output terminals (O1,O1';O2,O2') are arranged diagonally across from each other in each of said bridges (B1,B2) along another bridge diagonal thereof and a controllable power supply means (PW) for supplying electric power to said sensor components (10,11); said method comprising the steps of:

a) placing said contactless magneto-resistive angle sensing device in a rotating magnetic field;

b) controlling said input voltages with said power supply to heat and maintain said two sensor components at each of at least two different temperature;

c) measuring said output signals (U1,U2) as a function of orientation angle (φ) of said rotating magnetic field at at least two different temperatures obtain measured orientation angles and a family of curves representing a dependence of angular deviation of measured and actual angular position as a function of temperature;

d) determining a special angle at which said curves obtained by step c) intersect;

e) storing said special angle as a reference angle for subsequent angular measurements;

f) rotatably mounting said contactless magnetoresistive angle sensing device in a rotationally fixed magnetic field oriented at said at least one reference angle relative to said sensing device; and g) after step f), making said subsequent angular position measurements when said contactless magnetoresistive angle sensing device is rotated in said fixed magnetic field.

\* \* \* \* \*